United States Patent
Fan et al.

(10) Patent No.: US 12,520,555 B2
(45) Date of Patent: Jan. 6, 2026

(54) INNER SPACER FOR A MULTI-GATE DEVICE AND RELATED METHODS

(71) Applicant: Taiwan Semiconductor Manufacturing Company, Ltd., Hsinchu (TW)

(72) Inventors: Wei-Han Fan, Hsin-Chu (TW); Chia-Pin Lin, Hsinchu County (TW); Wei-Yang Lee, Taipei (TW); Tzu-Hua Chiu, Hsinchu (TW); Kuan-Hao Cheng, Hsinchu (TW); Po-Shao Lin, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 536 days.

(21) Appl. No.: 17/662,038

(22) Filed: May 4, 2022

(65) Prior Publication Data
US 2023/0017036 A1   Jan. 19, 2023

Related U.S. Application Data

(60) Provisional application No. 63/222,890, filed on Jul. 16, 2021.

(51) Int. Cl.
*H10D 64/01* (2025.01)
*H10D 30/01* (2025.01)
(Continued)

(52) U.S. Cl.
CPC ......... *H10D 64/018* (2025.01); *H10D 30/031* (2025.01); *H10D 30/6734* (2025.01); *H10D 30/6735* (2025.01); *H10D 30/6757* (2025.01); *H10D 30/797* (2025.01); *H10D 62/118* (2025.01); *H10D 64/01* (2025.01);
(Continued)

(58) Field of Classification Search
None
See application file for complete search history.

(56) References Cited

U.S. PATENT DOCUMENTS

| 8,796,666 B1 | 8/2014 | Huang et al. |
| 8,815,712 B2 | 8/2014 | Wan et al. |

(Continued)

FOREIGN PATENT DOCUMENTS

| CN | 108695377 A | 10/2018 |

*Primary Examiner* — Telly D Green
(74) *Attorney, Agent, or Firm* — Haynes and Boone, LLP

(57) ABSTRACT

A method of fabricating a device includes providing a fin having a stack of epitaxial layers including a plurality of semiconductor channel layers interposed by a plurality of dummy layers. A source/drain etch process is performed to remove portions of the stack of epitaxial layers in source/drain regions to form trenches that expose lateral surfaces of the stack of epitaxial layers. A dummy layer recess process is performed to laterally etch the plurality of dummy layers to form recesses along sidewalls of the trenches. An inner spacer material is deposited along sidewalls of the trenches and within the recesses. An inner spacer etch-back process is performed to remove the inner spacer material from the sidewalls of the trenches and to remove a portion of the inner spacer material from within the recesses to form inner spacers having a dish-like region along lateral surfaces of the inner spacers.

20 Claims, 11 Drawing Sheets

(51) Int. Cl.
  *H10D 30/67*  (2025.01)
  *H10D 30/69*  (2025.01)
  *H10D 62/10*  (2025.01)

(52) U.S. Cl.
  CPC ......... *H10D 64/015* (2025.01); *H10D 64/021* (2025.01); *H10D 64/017* (2025.01)

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,954,058 B1 * | 4/2018 | Mochizuki ........... H10D 62/121 |
| 2013/0285116 A1 | 10/2013 | Lochtefeld et al. |
| 2018/0190829 A1 * | 7/2018 | Song ................ H01L 21/02532 |
| 2019/0131431 A1 * | 5/2019 | Cheng ............... H01L 29/66439 |
| 2019/0165156 A1 * | 5/2019 | Lin ....................... H01L 29/785 |
| 2019/0378915 A1 * | 12/2019 | Frougier ............. H10D 62/121 |
| 2020/0006158 A1 * | 1/2020 | Chen ................... H10D 84/853 |
| 2020/0098886 A1 * | 3/2020 | Liu ....................... H10D 64/015 |
| 2020/0227534 A1 | 7/2020 | Chiang |
| 2020/0266060 A1 * | 8/2020 | Cheng ................ H01L 29/0673 |
| 2021/0035870 A1 * | 2/2021 | Young ................. H10D 84/038 |
| 2022/0302258 A1 * | 9/2022 | More .................. H10D 30/014 |
| 2022/0336626 A1 * | 10/2022 | Cheng ................ H10D 84/0158 |
| 2022/0336636 A1 * | 10/2022 | Liu .................... H10D 30/6757 |

\* cited by examiner

INNER SPACER FOR A MULTI-GATE DEVICE AND RELATED METHODS

CROSS-REFERENCE TO RELATED APPLICATION

This application claims the benefit of U.S. Provisional Application No. 63/222,890, filed Jul. 16, 2021, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, fabrication of GAA transistors has introduced new challenges to the semiconductor manufacturing process and has led to associated device reliability concerns. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
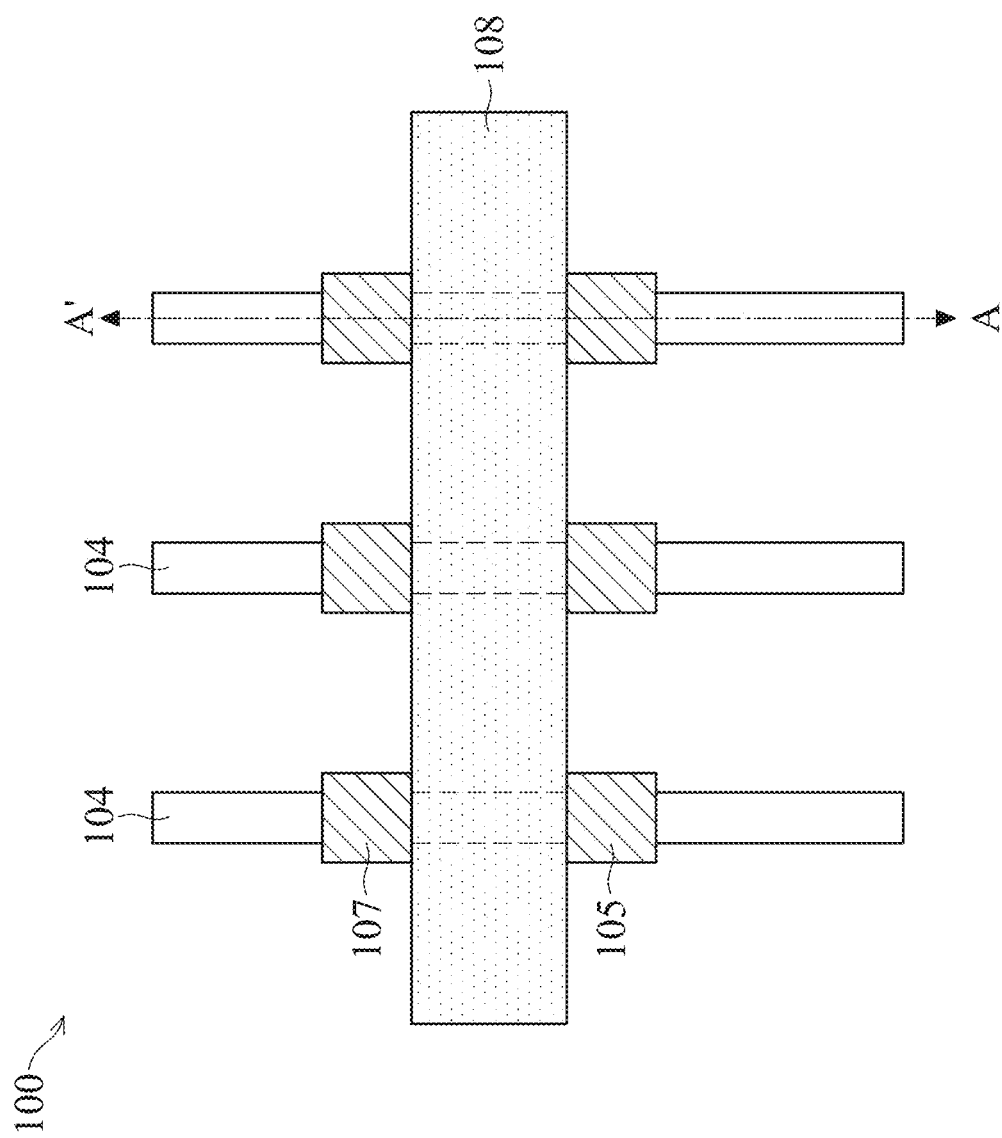
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

It is also noted that the present disclosure presents embodiments in the form of multi-gate transistors. Multi-gate transistors include those transistors whose gate structures are formed on at least two-sides of a channel region. These multi-gate devices may include a P-type transistor or an N-type transistor. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

For GAA transistors, inner spacers are formed between lateral ends of adjacent semiconductor channel layers, and between a source/drain feature and a gate structure formed in a channel region between adjacent semiconductor channel layers. In general, a sidewall profile of the inner spacers is critical for both device and yield performance. In an exemplary GAA transistor process flow, fins may be formed that include an epitaxial stack of layers (e.g., alternating semiconductor channel layers and dummy layers) and one or more dummy gate stacks formed over the epitaxial stack of layers. A source/drain etch process may be performed to remove portions of the epitaxial stack of layers in source/drain regions of the device, adjacent to the dummy gate stacks, to form trenches. The source/drain etch process may expose sidewall surfaces of the epitaxial stack of layers, including sidewall surfaces of the semiconductor channel layers and the dummy layers. A dummy sheet recess process may be performed to laterally etch the dummy layers to form recesses along sidewalls of the previously formed trenches. Inner spacers may then be formed within the recesses along the sidewalls of the trenches. In at least some conventional implementations, formation of the inner spacers may include deposition of an inner spacer material along sidewalls of the trenches and within the recesses. The as-deposited inner spacer material may have a thickness 'Tdep'. The deposited inner spacer material may then be etched back (trimmed), being removed from sidewall surfaces of the trenches while remaining within the recesses, to form inner spacers that substantially fill the recesses along the sidewalls of the trenches. Thereafter, a source/drain feature may be formed within the trenches and in contact with the adjacent inner spacers and semiconductor channel layers of the GAA transistor.

For P-type transistors, and in some implementations, the semiconductor channel layers may include silicon (Si), and the source/drain feature may include silicon germanium (SiGe). Due to the lattice mismatch between Si and SiGe, the SiGe source/drain feature may induce strain within the Si channel layers. The induced strain, in turn, serves to enhance the channel mobility, resulting in improved drive current and device performance. However, the strain induced within the channel layers may be limited by the size of the trench within which the source/drain feature is formed. Stated another way, the available volume within which the source/drain feature may be formed may limit the amount of strain that can be induced by the source/drain feature onto the semiconductor channel layer.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for increasing a volume of a source/drain feature in order to increase the strain induced within a semiconductor channel layer, thereby further enhancing device performance. In contrast to at least some existing implementations, and in accordance with some embodiments, after deposition of an inner spacer material along sidewalls of the trenches and within the recesses, an inner spacer etch-back (trim) process may be performed to remove the inner spacer material from sidewall surfaces of the trenches while also removing part of the inner spacer material from within the recesses to form a dish-like region along a lateral surface of the inner spacer (e.g., facing the trench) in order to increase a volume of a source/drain feature subsequently formed in the trench. That is, the subsequently formed source/drain feature will be formed within the trench and within the dish-like region along the lateral surface of the inner spacer, effectively providing a larger volume for the source/drain feature. This will result in enhanced strain within the semiconductor channel layer and improved device performance. In some embodiments, the inner spacer etch-back (trim) process may be performed using a wet etch, a dry etch, or a combination thereof. In some cases, the inner spacer etch-back (trim) process may include cycles of a high temperature sulfuric peroxide mixture (HTSPM) and dilute hydrofluoric acid (dHF), ozone ($O_3$) and dHF, or a combination thereof. It will be understood that the parameters given for the inner spacer trim process are merely exemplary, and other parameters may be used without departing from the scope of the present disclosure. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
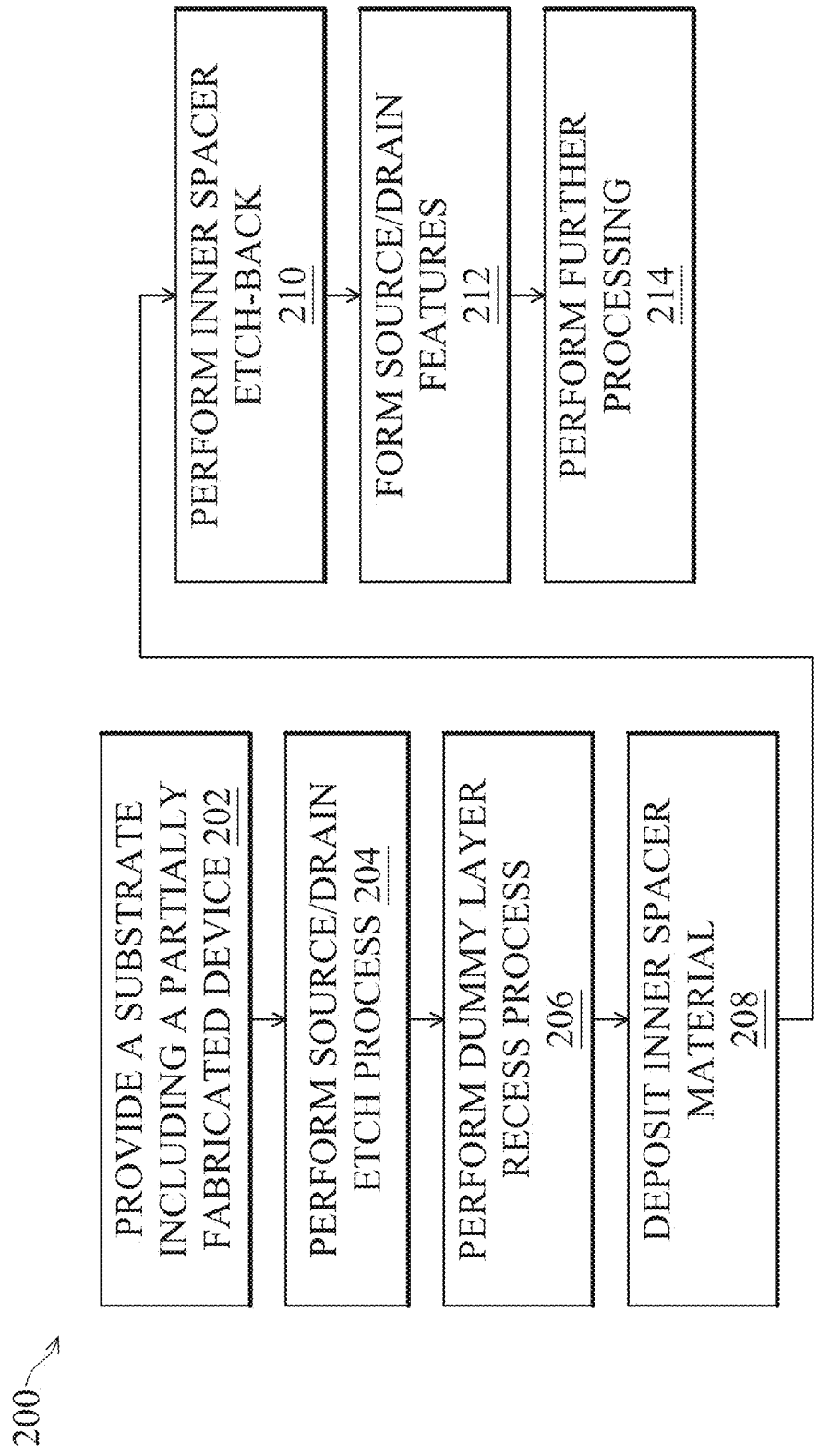
FIG. 2 is a flow chart of a method of fabricating a semiconductor device 300 according to one or more aspects of the present disclosure.

Referring to FIG. 2, illustrated therein is a method 200 of semiconductor fabrication including fabrication of a semiconductor device 300 (e.g., which includes a multi-gate device) having a dished inner spacer profile to provide an increased volume for an epitaxial source/drain feature, in accordance with various embodiments. The method 200 is discussed below with reference to fabrication of GAA transistors. However, it will be understood that aspects of the method 200 may be equally applied to other types of multi-gate devices, or to other types of devices implemented by the multi-gate devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is noted that certain aspects of the method 200 are described as being performed in a region of the semiconductor device 300 including a particular device type (e.g., such as a P-type device or an N-type device). However, if not described as being performed in a region including a particular device type, the step of the method 200 being described may be assumed as being performed across a plurality of regions including a plurality of devices types (e.g., across a plurality of device type regions). Additionally, in at least some embodiments, the advantages of the dished inner spacer profile to provide an increased volume for an epitaxial source/drain feature may be beneficial for both P-type and N-type devices (e.g., when applying channel strain in a P-type or N-type device using an appropriate epitaxial source/drain material), and in some cases physical features of the device structures formed by the method 200 may be substantially the same for both P-type and N-type devices. Further, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 may include a plurality of semiconductor devices (e.g., transistors) which may be interconnected. Moreover, it is noted that the process steps of method 200, including any descriptions given with reference to the figures are merely exemplary and are not intended to be limiting beyond what is specifically recited in the claims that follow.

Figure 3:
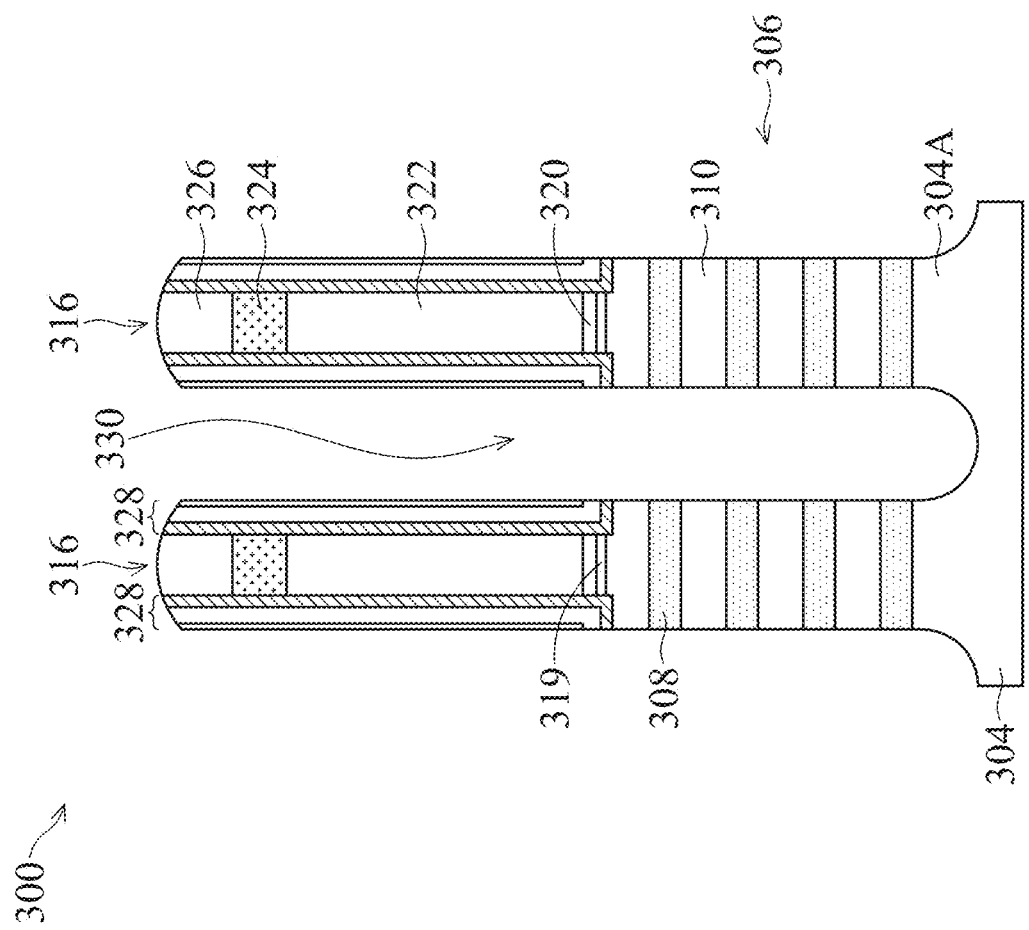
FIGS. 3, 4, 5, 6, and 8 provide cross-sectional views of an embodiment of the semiconductor device 300 along a plane substantially parallel to a plane defined by section AA' of FIG. 1, in accordance with some embodiments.

The method 200 begins at block 202 where a substrate including a partially fabricated device is provided. Referring to the example of FIG. 3, in an embodiment of block 202, a partially fabricated P-type device 300 is provided. FIG. 3 provides a cross-sectional view of an embodiment of the semiconductor device 300 along a plane substantially parallel to a plane defined by section AA' of FIG. 1 (e.g., along the direction of a fin 306). The device 300 may be formed on a substrate 304. In some embodiments, the substrate 304 may be a semiconductor substrate such as a silicon substrate. The substrate 304 may include various layers, including conductive or insulating layers formed on a semiconductor substrate. The substrate 304 may include various doping configurations depending on design requirements as is known in the art. The substrate 304 may also include other semiconductors such as germanium, silicon carbide (SiC), silicon germanium (SiGe), or diamond. Alternatively, the substrate 304 may include a compound semiconductor and/or an alloy semiconductor. Further, the substrate 304 may optionally include an epitaxial layer (epi-layer), may be strained for performance enhancement, may include a silicon-on-insulator (SOI) structure, and/or have other suitable enhancement features.

As shown in FIG. 3, the device 300 includes a fin 306 having a substrate portion 304A (formed from the substrate 304), epitaxial layers 308 of a first composition and epitaxial layers 310 of a second composition that interpose the layers 308 of the first composition. In some cases, trench isolation (STI) features may be formed to isolate the fin 306 from neighboring fins. In an embodiment, the epitaxial layers 308 of the first composition include SiGe and the epitaxial layers of the second composition 310 include silicon (Si). It is also noted that while the layers 308, 310 are shown as having a particular stacking sequence within the fin 306, where the layer 310 is the topmost layer of the stack of layers 308, 310, other configurations are possible. For example, in some cases, the layer 308 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure.

In various embodiments, the epitaxial layers 310 (e.g., including the second composition), or portions thereof, may form a channel region of a GAA transistor of the device 300. For example, the layers 310 may be referred to as semiconductor channel layers that are used to form a channel region of a GAA transistor. In various embodiments, the semiconductor channel layers (e.g., the layers 310 or portions thereof) may include nanosheet channel(s), nanowire channel(s), bar-shaped channel(s), and/or other suitable channel configurations. The semiconductor channel layers are also used to form portions of the source/drain features of the GAA transistor, as discussed below.

It is noted that while the fin 306 is illustrated as including four (4) layers of the epitaxial layer 308 and four (4) layers of the epitaxial layer 310, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some embodiments, the number of epitaxial layers 310, and thus the number of semiconductor channel layers, is between 3 and 10.

In some embodiments, the epitaxial layers 308 each have a thickness range of about 4-8 nanometers (nm), and the epitaxial layers 310 each have a thickness range of about 4-8 nm. As noted above, the epitaxial layers 310 may serve as channel region(s) for a subsequently formed multi-gate device (e.g., a GAA transistor) and its thickness may be chosen based at least in part on device performance considerations. The epitaxial layers 308 may serve to define a gap distance between adjacent channel region(s) for the subsequently formed multi-gate device and its thickness may also be chosen based at least in part on device performance considerations.

The device 300 further includes gate stacks 316 formed over the fin 306 of the P-type device 300. In an embodiment, the gate stacks 316 are dummy (sacrificial) gate stacks that are subsequently removed and replaced by the final gate stack at a subsequent processing stage of the device 300. For example, the gate stacks 316 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fin 306 underlying the gate stacks 316 may be referred to as the channel region of the device 300. The gate stacks 316 may also define a source/drain region of the fin 306, for example, the regions of the fin 306 adjacent to and on opposing sides of the channel region.

In some embodiments, the gate stacks 316 include a dielectric layer 320 and an electrode layer 322. The gate stacks 316 may also include one or more hard mask layers 324, 326. In some embodiments, the hard mask layer 324 may include an oxide layer, and the hard mask layer 326 may include a nitride layer. In some embodiments, the dielectric layer 320 includes silicon oxide. Alternatively, or additionally, the dielectric layer 320 may include silicon nitride, a high-K dielectric material or other suitable material. In some embodiments, the electrode layer 322 may include polycrystalline silicon (polysilicon). In some embodiments, the oxide of the hard mask layer 324 includes a pad oxide layer that may include $SiO_2$. In some embodiments, the nitride of the hard mask layer 326 includes a pad nitride layer that may include $Si_3N_4$, silicon oxynitride or silicon carbide. In some examples, an optional sacrificial layer 319 may be formed directly beneath the dielectric layer 320. The optional sacrificial layer 319 may include SiGe, Ge, or other appropriate material, and may be used in some cases to prevent nanosheet loss (e.g., such as loss of material from the epitaxial layers 308, 310) during previous processing steps.

In some embodiments, one or more spacer layers 328 may be formed on sidewalls of the gate stacks 316. In some cases, the one or more spacer layers 328 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the one or more spacer layers 328 include multiple layers, such as main spacer layers, liner layers, and the like.

The method 200 then proceeds to block 204 where a source/drain etch process is performed. Still with reference to FIG. 3, in an embodiment of block 204, a source/drain etch process is performed to the P-type device 300. In some embodiments, the source/drain etch process is performed to remove the exposed epitaxial layers 308, 310 in source/drain regions of the P-type device 300 to form trenches 330 which expose underlying portions of the substrate 304. The source/drain etch process also serves to expose lateral surfaces of the epitaxial layers 308, 310, as shown in FIG. 3. In some embodiments, the source/drain etch process may also remove portions of the one or more spacer layers 328 (e.g., from top surfaces of the gate stacks 316). In some embodiments, the source/drain etch process may include a dry etching process, a wet etching process, and/or a combination thereof.

Figure 4:
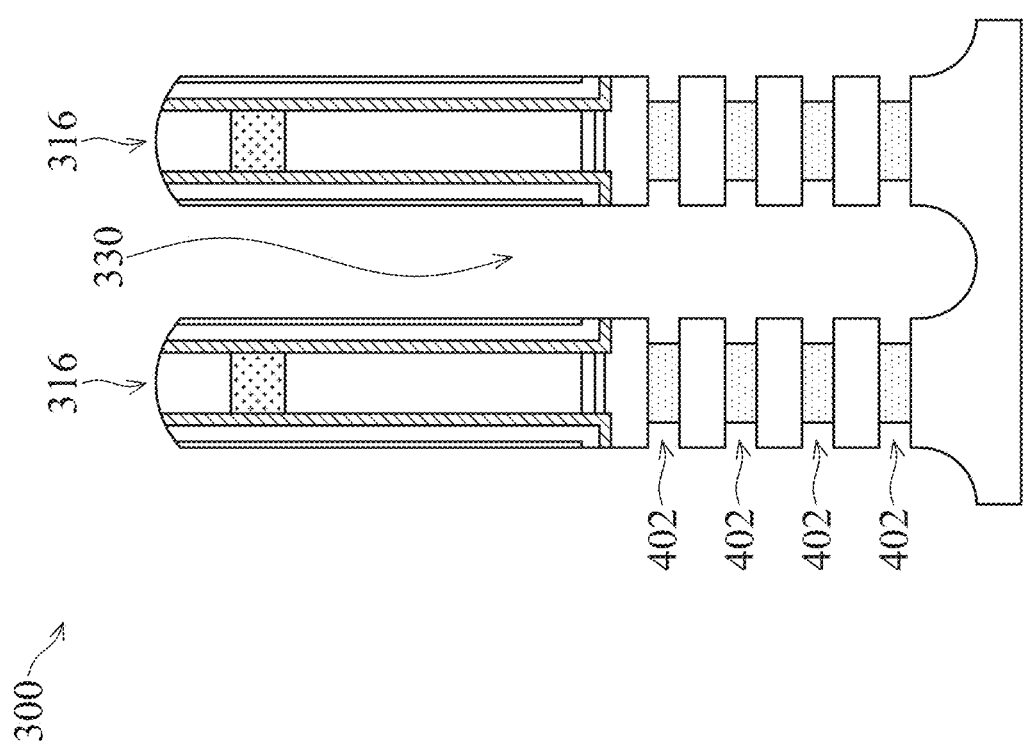

The method 200 then proceeds to block 206 where a dummy layer recess process is performed. Referring to FIG. 3 and FIG. 4, in an embodiment of block 206, a dummy layer recess process is performed to the P-type device 300. The dummy layer recess process includes a lateral etch of the epitaxial layers 308 (e.g., which may include SiGe) of the P-type device 300 to form recesses 402 along sidewalls of the trenches 330. In some embodiments, the dummy layer recess process is performed using a dry etching process, a wet etching process, and/or a combination thereof. In some cases, the dummy layer recess process may include etching using a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch. As a result of the dummy layer recess process, exposed lateral surfaces of the recessed epitaxial layers 308 (the dummy layers) may define concave, convex, or substantially vertical profiles along opposing lateral surfaces of the epitaxial layers 308. During a later stage of processing, as discussed below, the epitaxial layers 308 (the dummy layers) will be removed and replaced by a portion of a gate structure (e.g., a metal gate structure) such that the replacement gate structure defines the concave, convex, or substantially vertical profiles. In various examples, the replacement gate structure will interface an inner spacer, as also described in more detail below.

Figures 5, 5A:
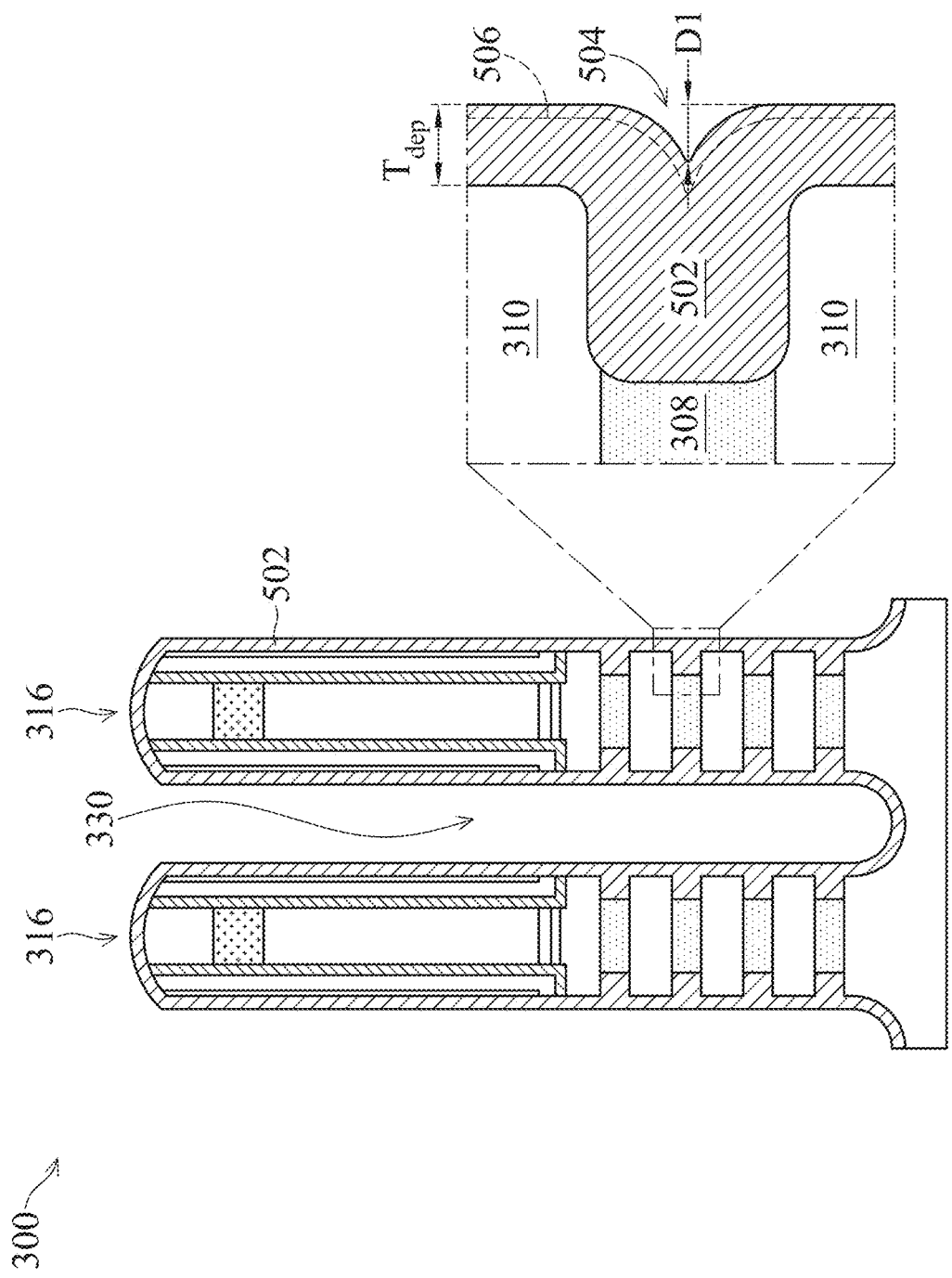
FIG. 5A provides a zoomed-in view of a portion of the semiconductor device 300 shown in FIGS. 5, in accordance with some embodiments.

In some cases, and as a result of the dummy layer recess process of block 206, ends of the epitaxial layers 310 in LDD regions of the device 300 (e.g., beneath the one or more spacer layers 328 on opposing ends of the channel region) may be partially etched such that the epitaxial layers 310 may be slightly thinner in the LDD region as compared to the channel region (e.g., directly beneath the gate stacks 316), as more clearly illustrated in FIG. 5A. By way of example, the consumption from each of the top and bottom surfaces of the epitaxial layers 310 in the LDD region, as a result of the dummy layer recess process, may be in a range of about 0.5-1 nm, for a total consumption from both top and bottom surfaces of the epitaxial layers 310 of about 1-2 nm. To be sure, in some embodiments, ends of the epitaxial layers 310 in the LDD region may not be etched during the dummy layer recess process.

The method 200 then proceeds to block 208 where deposition of an inner spacer material is performed. Referring to FIG. 4 and FIGS. 5/5A, in an embodiment of block 208, an inner spacer material 502 is deposited over the device 300 and within the trenches 330. The inner spacer material 502 is also deposited within the recesses 402 formed along sidewalls of the trenches 330 during the dummy layer recess process of block 206. In some cases, the inner spacer material 502 may have a thickness 'Tdep' of about 4-15 nm. In some embodiments, the inner spacer material 502 may include amorphous silicon. In some examples, the inner spacer material 502 may include a dielectric material such as silicon oxide, silicon nitride, silicon carbide, silicon oxynitride, SiCN, silicon oxycarbide, SiOCN, a low-K material (e.g., with a dielectric constant 'k' <7), and/or combinations thereof. By way of example, the inner spacer material 502 may be formed by conformally depositing the inner spacer material 502 over the device 300 using processes such as a CVD process, a subatmospheric CVD (SACVD) process, a flowable CVD process, an ALD process, a PVD process, or other suitable process. As shown in FIG. 5A, and as a result of the conformal deposition of the inner spacer material 502 within the recesses 402, the deposited inner spacer material may define a recess or dish-like region 504. In some embodiments, the recess or dish-like region 504 may have a depth 'D1', as measured from a plane defined by an exposed surface of the inner spacer material 502 disposed on a lateral surface of an adjacent epitaxial layer 310 to an apex of the recess or dish-like region 504. FIG. 5A also illustrates a contour 506 to generally show the progression of the thickness reduction of the inner spacer material 502 during a subsequent inner spacer etch-back process, in accordance with some embodiments.

The method 200 then proceeds to block 210 where an inner spacer etch-back process (trim process) is performed. Referring to FIGS. 5/5A and FIGS. 6/6A, in an embodiment of block 210, an inner spacer etch-back process (trim process) may be performed to the P-type device 300. In various examples, the inner spacer etch-back process etches (trims) the inner spacer material 502 from over the device 300 and along sidewalls of the trenches 330, while the inner spacer material 502 remains at least partially disposed within the recesses 402, thereby providing inner spacers for the device 300. Stated another way, the inner spacer etch-back process of block 210 at least partially etches (trims) the inner spacer material 502 from within the recesses 402 to form a recess or dish-like region 604 along a lateral surface of the inner spacer (e.g., facing the trench 330). In some cases, an inner spacer having the recess or dish-like region 604 along a lateral surface of the inner spacer may be equivalently referred to as a dished inner spacer or a recessed inner spacer. In various embodiments, the dish-like region 604 serves to increase an available volume within which a source/drain feature may be subsequently formed, thereby increasing strain induced within a semiconductor channel layer (the epitaxial layers 310) and enhancing performance of the device 300. In some embodiments, the recess or dish-like region 604 may have a depth 'D2', as measured from a plane defined by an exposed lateral surface of an adjacent epitaxial layer 310 to an apex of the recess or dish-like region 604. By way of example, the depth 'D2' of the dish-like region 604 may be greater than about 1 nm. In addition, and in some cases, an angle 'θ' may be defined between a horizontal surface of an adjacent epitaxial layer 310 and an exposed, etched-back surface of the inner spacer 502 (e.g., an exposed surface of the dish-like region 604), where the angle 'θ' may be greater than about 30 degrees. In some embodiments, the dish-like region 604 formed as a result of the etch-back process (block 210) may be larger than the dish-like region 504 formed as a result of the conformal deposition of the inner spacer material 502 (block 208). Thus, in some cases, the depth 'D2' of the dish-like region 604 may be greater than the depth 'D1' of the dish-like region 504. By way of example, the inner spacer etch-back process may be performed using a wet etch process, a dry etch process, or a combination thereof. In some embodiments, the inner spacer etch-back (trim) process may include cycles of a high temperature sulfuric peroxide mixture (HTSPM) and dilute hydrofluoric acid (dHF), ozone ($O_3$) and dHF, or a combination thereof. In some cases, any residual portions of the inner spacer material 502 that remain on top surfaces of the device 300 and/or on sidewalls or bottom surfaces of the trenches 330, for example after the inner spacer etch-back process of block 210, may be removed during a subsequent clean process (e.g., prior to epitaxial growth of source/drain features). In various examples, the inner spacer material 502 (e.g., that remains disposed within the recesses 402) may be disposed at least partially beneath the one or more spacer layers 328 (formed on sidewalls of the gate stacks 316) while abutting subsequently formed source/drain features, described below.

Figures 6, 6A:
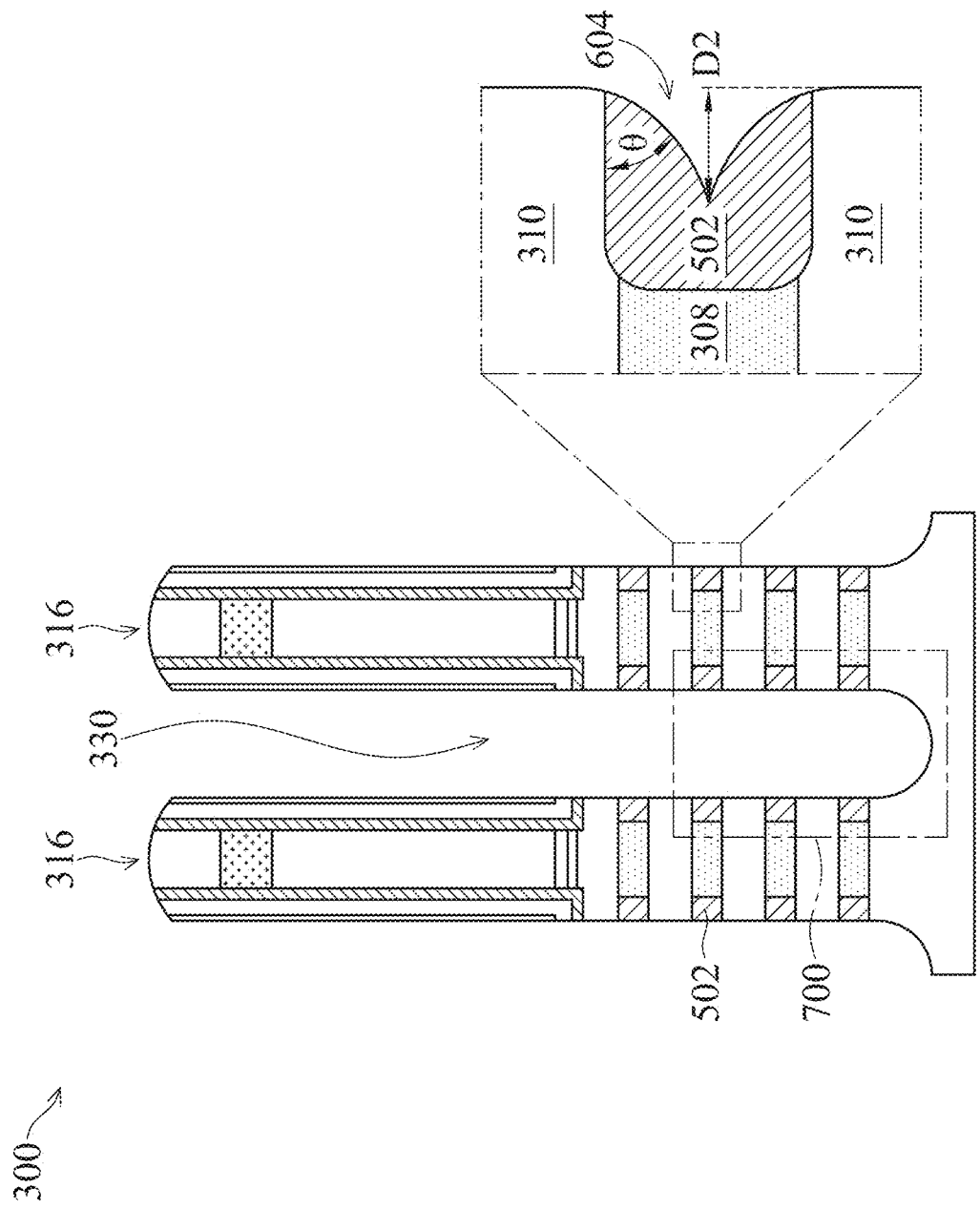
FIG. 6A provides a zoomed-in view of a portion of the semiconductor device 300 shown in FIGS. 6, in accordance with some embodiments.
Figure 7:
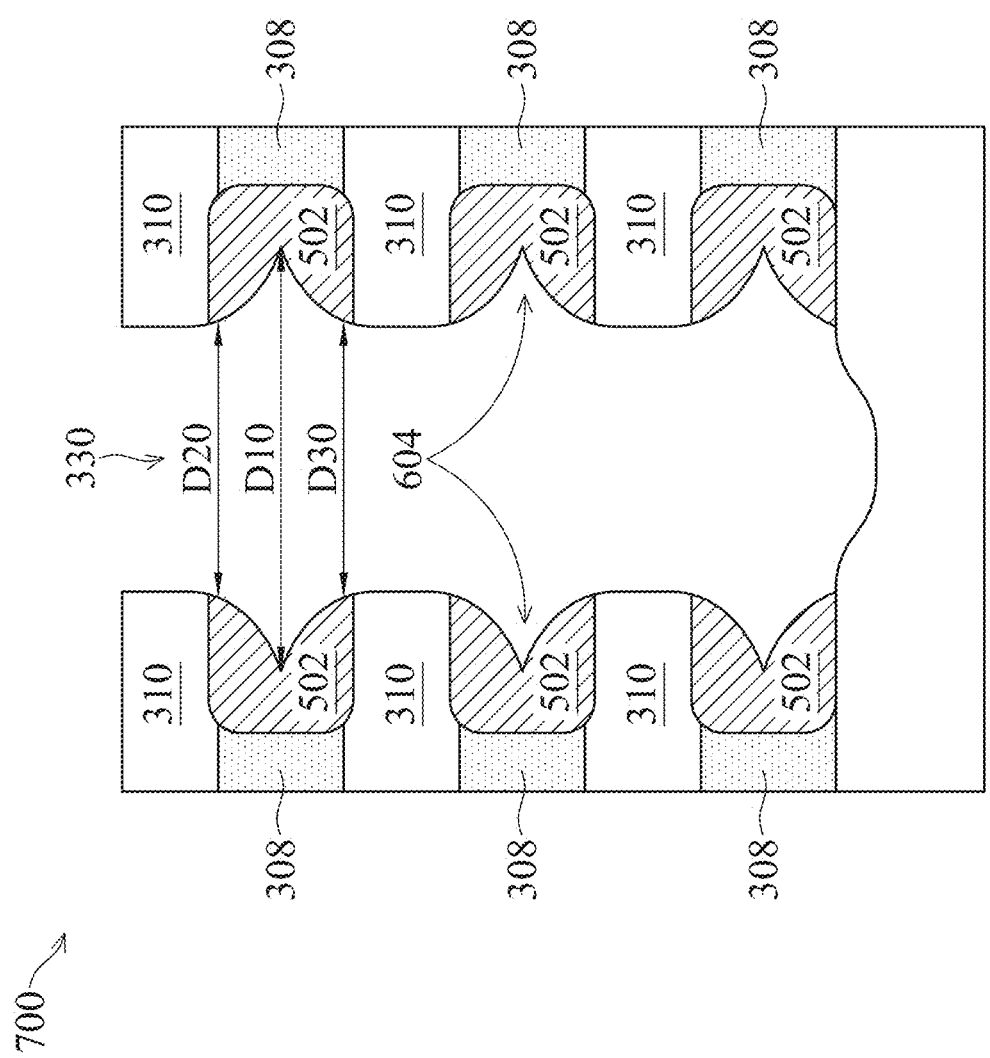
FIGS. 7 and 10 illustrate an enlarged view of a portion 700 of the semiconductor device 300 as shown in FIG. 6, in accordance with some embodiments.

To provide a more detailed view of various features of the device 300 after the inner spacer etch-back process (trim process) of block 210, reference is made to FIG. 7, which illustrates an enlarged view of a portion 700 of the device 300 as shown in FIG. 6. The illustrated portion 700 includes a plurality of epitaxial layers 310 (semiconductor channel layers), recessed epitaxial layers 308 (the dummy layers), inner spacers 502 having the dish-like regions 604, and a portion of the trench 330. As previously noted, the regions in which the trenches 330 are formed include source/drain regions of the device 300, within which a source/drain feature will be subsequently formed. The view of FIG. 7 also illustrates spacings between upper, middle, and lower portions of the dish-like regions 604 on opposing sides of the source/drain region. As shown, a distance 'D10' between middle (apex) portions of opposing dish-like regions 604 may be greater than a distance 'D20' between upper portions, and greater than a distance 'D30' between lower portions, of opposing dish-like regions 604. In at least some embodiments, the distance 'D20' may be substantially the same as the distance 'D30'. However, in some cases, the distance 'D20' and the distance 'D30' may be different. In some examples, the distance 'D10' may be in a range between about 24-38 nm, the distance 'D20' may be in a range between about 20-30 nm, and the distance 'D30' may be in a range between about 20-30 nm. The opposing dish-like regions 604 thus serve to increase an available volume within which a source/drain feature may be subsequently formed, as described below.

The method 200 then proceeds to block 212 where source/drain features are formed. Referring to FIGS. 6, 7, 8, and 9, in an embodiment of block 212, source/drain features 802 are formed in the P-type device 300. Thus, the source/drain features 802 may include P-type source/drain features. In some embodiments, the source/drain features 802 are formed in source/drain regions adjacent to and on either side of the gate stacks 316 of the device 300. For example, the source/drain features 802 may be formed within the trenches 330 of the device 300, including within the dish-like regions 604, over the exposed portions of the substrate 304 and in contact with the adjacent inner spacers 502 and the semiconductor channel layers (the epitaxial layers 310) of the device 300. In some embodiments, a clean process may be performed immediately prior to formation of the source/drain features 802. The clean process may include a wet etch, a dry etch, or a combination thereof. In addition, the clean process may remove any residual portions of the inner spacer material 502 that remained on top surfaces of the device 300 and/or on sidewalls or bottom surfaces of the trenches 330 (e.g., after the inner spacer etch-back process of block 210).

In some embodiments, the source/drain features 802 are formed by epitaxially growing a semiconductor material layer in the source/drain regions. In various embodiments, the semiconductor material layer grown to form the source/drain features 802 may include Ge, Si, GaAs, AlGaAs, SiGe, GaAsP, SiP, or other suitable material. The source/drain features 802 may be formed by one or more epitaxial (epi) processes. In some embodiments, the source/drain features 802 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 802 are not in-situ doped, and instead an implantation process is performed to dope the source/drain features 802.

Figure 8:
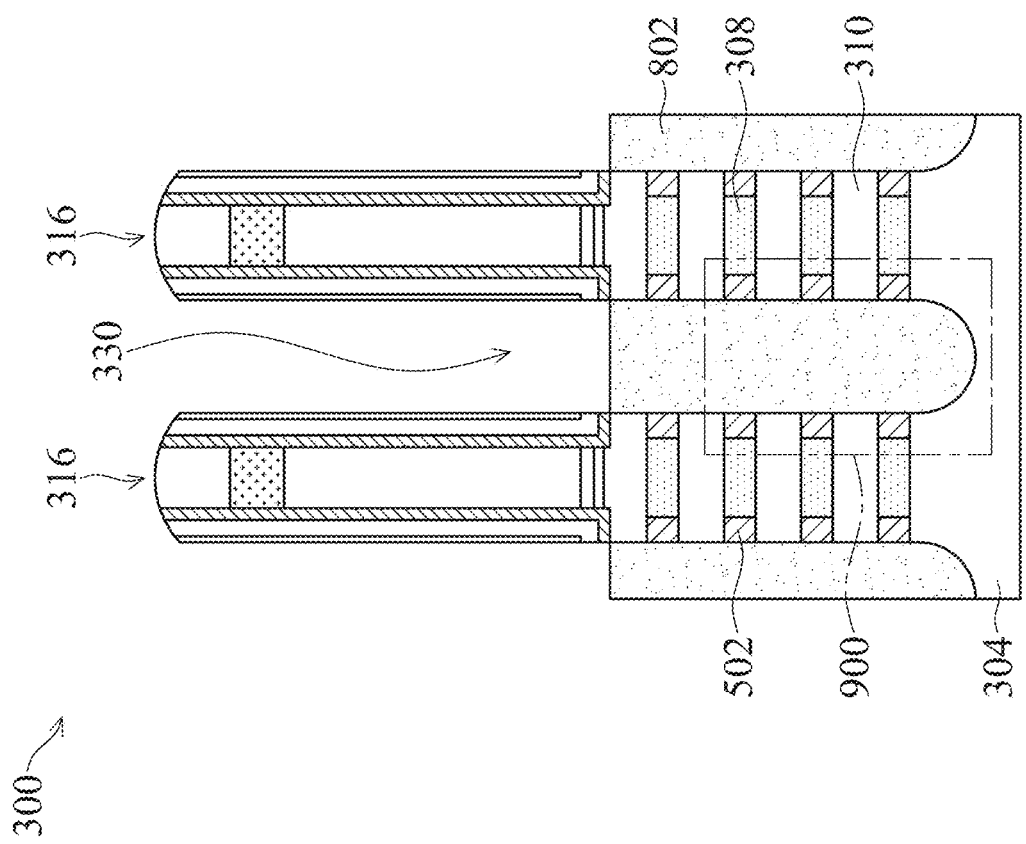
Figure 9:
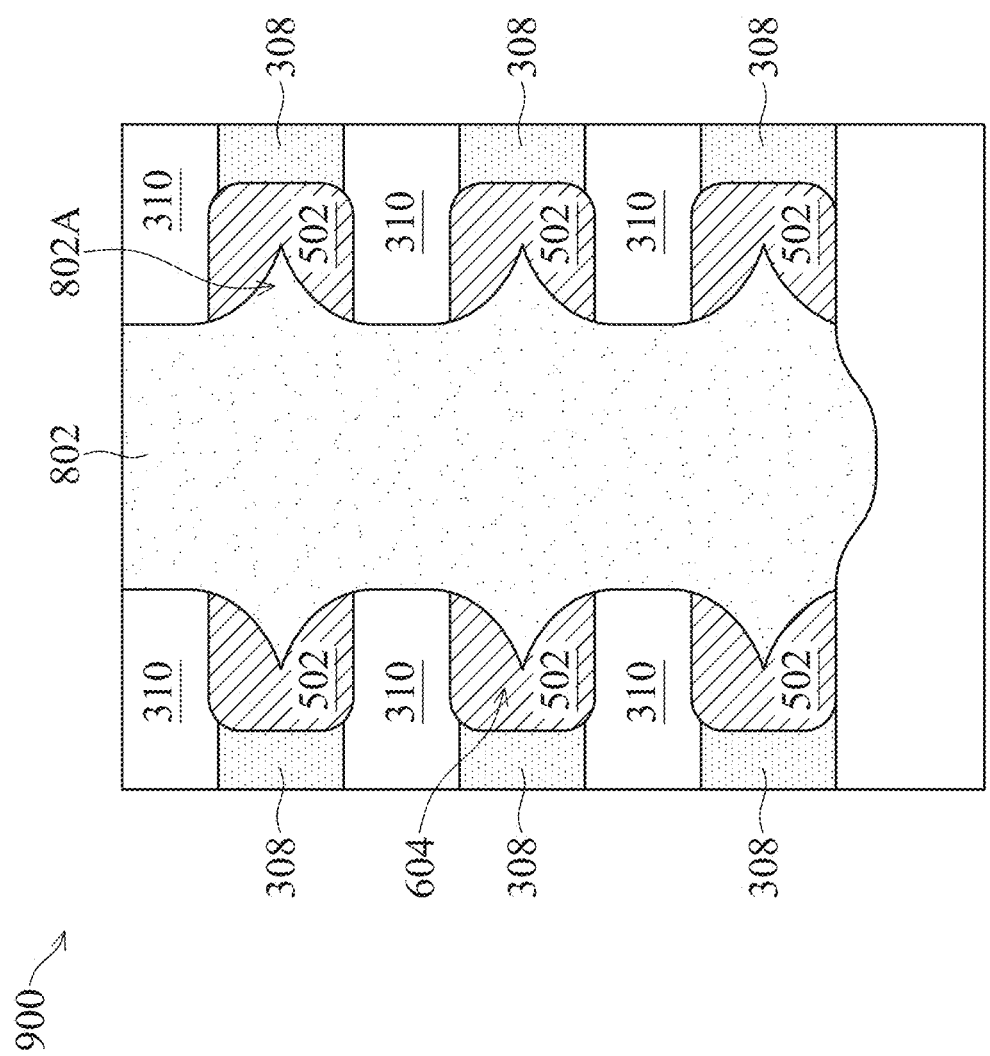
FIGS. 9 and 11 illustrate an enlarged view of a portion 900 of the semiconductor device 300 as shown in FIG. 8, in accordance with some embodiments.

To provide a more detailed view of various features of the device 300 after the formation of the source/drain features of block 212, reference is made to FIG. 9, which illustrates an enlarged view of a portion 900 of the device 300 as shown in FIG. 8. In some embodiments, the portion 900 may illustrate a region of the device 300 that is substantially the same as the region of the device 300 illustrated by the portion 700, discussed above, albeit at a different stage of processing in accordance with the method 200. Thus, the illustrated portion 900 includes a plurality of epitaxial layers 310 (semiconductor channel layers), recessed epitaxial layers 308 (the dummy layers), and the inner spacers 502 having the dish-like regions 604. The portion 900 further illustrates the source/drain feature 802 formed in a source/drain region (e.g., within a trench 330), including within the dish-like regions 604 and in contact with the inner spacers 502 and the semiconductor channel layers (the epitaxial layers 310). In at least some embodiments, the source/drain feature 802 includes a SiGe source/drain feature, which may be used to induce strain with a semiconductor channel layer (e.g., such as a Si semiconductor channel layer) of the device 300. As previously noted, and because of the dish-like regions 604 of the inner spacers 502, the source/drain features 802 will include portions 802A that extend into the dish-like regions 604 and between lateral ends of adjacent epitaxial layers 310, thereby effectively increasing a volume of the source/drain features 802 (e.g., as compared to at least some existing implementations). In some embodiments, the source/drain features 802 induce strain within adjacent semiconductor channel layers (epitaxial layers 310). In particular, due to the increased volume of the source/drain features 802, the strain induced by the source/drain features 802 is increased (e.g., as compared to at least some existing implementations), thereby providing for enhanced device performance. It is also noted that in at least some embodiments, the source/drain features 802 themselves may be strained (e.g., by formation of the source/drain features 802 on a substrate portion having a different material composition and having a different lattice constant), which in turn may induce strain within the semiconductor channel layers and enhance device performance.

Figure 10:
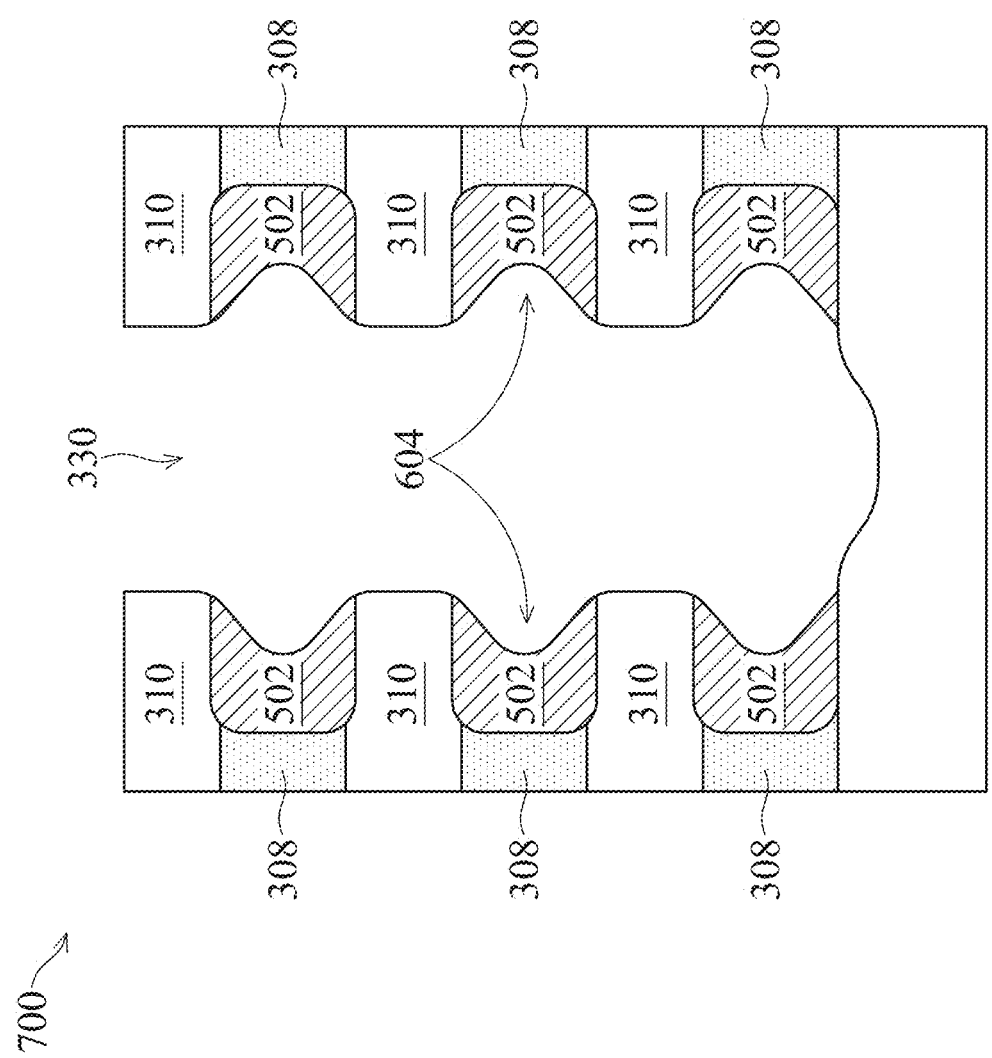
Figure 11:
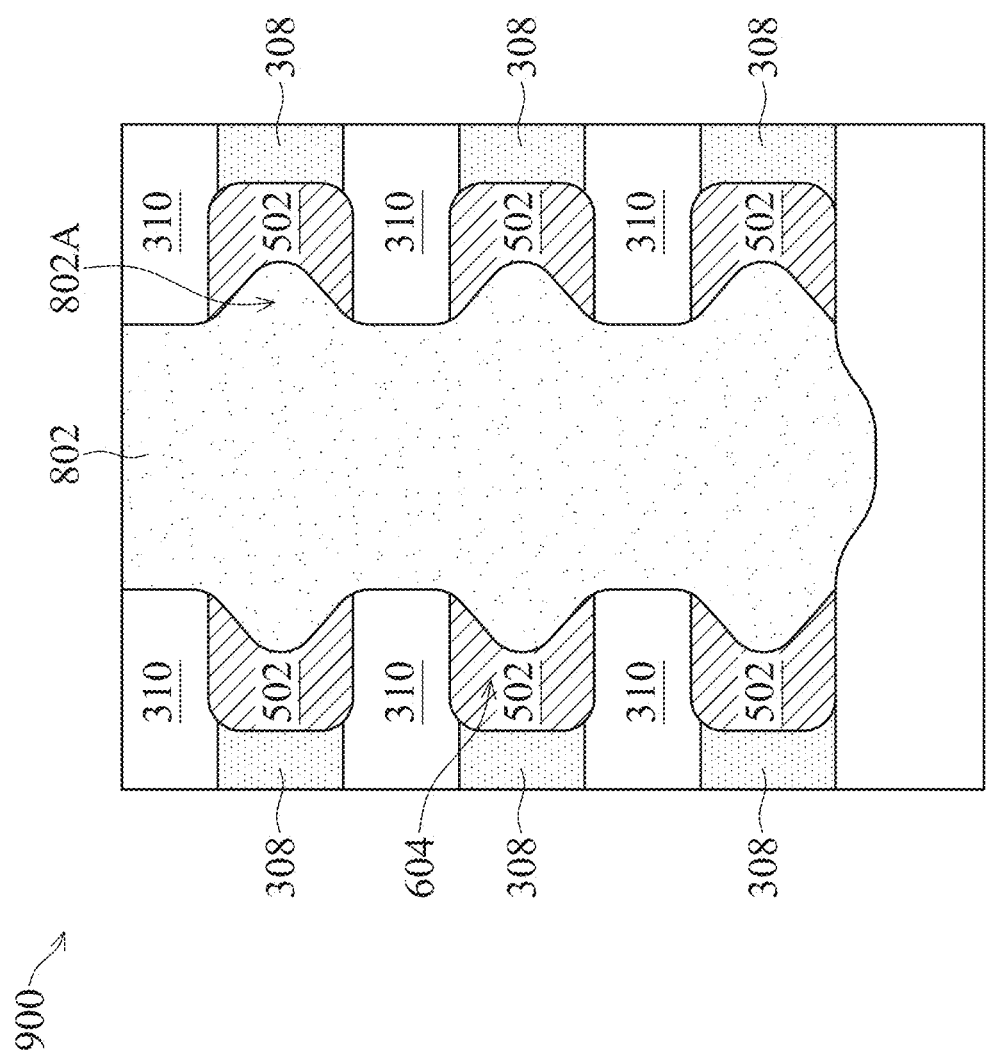

While the dish-like regions 604 of the inner spacers 502 shown in FIGS. 6A, 7, and 9, and the corresponding portions 802A of the source/drain features 802 shown in FIG. 9, are illustrated as having a generally triangular shape, other shapes are possible and within the scope of this disclosure. As one example, and with reference to FIG. 10, illustrated therein is an enlarged view of another embodiment of the portion 700 of the device 300 as shown in FIG. 6. Specifically, in the example of FIG. 10, the dish-like regions 604 have a generally concave shape. As a result of the generally concave shape of the dish-like regions 604, and with reference to FIG. 11, which provides an enlarged view of another embodiment of the portion 900 of the device 300 as shown in FIG. 8, the subsequently formed source/drain features 802 will include the portions 802A having a corresponding convex shape that extend into the concave dish-like regions 604, thereby effectively increasing a volume of the source/drain features 802. It will be understood that the above examples are merely exemplary and are not meant to be limiting, and other shapes and/or profiles of the dish-like regions 604 are possible without departing from the scope of the present disclosure. For example, in some alternative embodiments, the dish-like regions 604 may have a generally square shape, a generally trapezoidal shape, or other appropriate shape.

The method 200 then proceeds to block 214 where further processing is performed to the device 300. For example, after formation of the source/drain features 802 (block 212), a contact etch stop layer (CESL) and an inter-layer dielectric (ILD) layer are formed over the device 300 and a chemical mechanical polishing (CMP) process is performed. In some embodiments, the CMP process may expose a top surface of the gate stacks 316 (e.g., by removing portions of the ILD layer and CESL) overlying the gate stacks 316 and planarize a top surface of the device 300. In addition, the CMP process may remove the hard mask layers 324, 326 overlying the gate stacks 316 to expose the underlying electrode layer 322, such as a polysilicon electrode layer, of the dummy gate.

In a further embodiment of block 214, the exposed electrode layer 322 of the gate stacks 316 may initially be removed by suitable etching processes, followed by an etching process to remove the dielectric layer 320, and the optional sacrificial layer 319 (if included), from the gate stacks 316. In some examples, the etching processes may include a wet etch, a dry etch, or a combination thereof.

After removal of the dummy gates, and in a further embodiment of block 214, the epitaxial layers 308 (the dummy layers) in the channel region of the device 300 are selectively removed (e.g., using a selective etching process), while the semiconductor channel layers (epitaxial layers 310) remain unetched. In some examples, selective removal of the dummy layers may be referred to as a channel layer release process (e.g., as the semiconductor channel layers are released from the dummy layers). As a result of the selective removal of the dummy layers, gaps are formed between the adjacent epitaxial layers 310, with the inner spacers 502 disposed on opposing lateral ends of the gaps.

After selective removal of the dummy layers, and in a further embodiment of block 214, a gate structure is formed. The gate structure may include a high-K/metal gate stack, however other compositions are possible. In some embodiments, the gate structure may form the gate associated with the multi-channels provided by the plurality of exposed semiconductor channel layers (the exposed epitaxial layers 310) in the channel region of the device 300. In some embodiments, the gate structure includes an interfacial layer (IL) (e.g., such as silicon oxide ($SiO_2$), HfSiO, or silicon oxynitride) disposed on exposed surfaces of the epitaxial layers 310, and a high-K dielectric layer formed over the IL. In some embodiments, the high-K dielectric layer may include hafnium oxide ($HfO_2$). Alternatively, the high-K dielectric layer may include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In some examples, the high-K dielectric layer may also be formed on exposed surfaces of the inner spacers 502 on opposing lateral ends of the gaps. In various embodiments, the IL and the high-K dielectric layer collectively define a gate dielectric of the gate structure for the device 300.

In a further embodiment of block 214, a metal gate including a metal layer is formed over the gate dielectric (e.g., over the IL and the high-K dielectric layer). The metal layer may include a metal, metal alloy, or metal silicide. In various examples, the metal layer may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. Additionally, the formation of the gate dielectric/metal gate stack may include depositions to form various gate materials, one or more liner layers, and one or more CMP processes to remove excessive gate materials and thereby planarize a top surface of the device 300. In various embodiments, the formed gate structure includes portions that interpose each of the epitaxial layers 310, which each provide semiconductor channel layers for the device 300.

Generally, the semiconductor device 300 may undergo further processing to form various features and regions known in the art. For example, further processing may form various contacts/vias/lines and multilayer interconnect features (e.g., metal layers and interlayer dielectrics) on the substrate 304, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be modified, replaced, or eliminated in accordance with various embodiments of the method 200. It is also noted that while the method 200 has been described with reference to the P-type device 300, it will be understood that aspects of the method 200 may equally apply to fabrication of an N-type device, where such an N-type device may similarly include a dished inner spacer profile to provide an increased volume for an epitaxial source/drain feature.

With respect to the description provided herein, disclosed are methods and structures for increasing a volume of a source/drain feature in order to increase the strain induced within a semiconductor channel layer of a multi-gate device (e.g., a GAA transistor), thereby enhancing device performance. In contrast to at least some existing implementations, and in accordance with some embodiments, after deposition of an inner spacer material along sidewalls of the trenches and within the recesses, an inner spacer etch-back (trim) process may be performed to remove the inner spacer material from sidewall surfaces of the trenches while also removing part of the inner spacer material from within the recesses to form a dish-like region along a lateral surface of the inner spacer (e.g., facing the trench) in order to increase a volume of a source/drain feature subsequently formed in the trench. That is, the subsequently formed source/drain feature will be formed within the trench and within the dish-like region along the lateral surface of the inner spacer, effectively providing a larger volume for the source/drain feature. This will result in enhanced strain within the semiconductor channel layer and improved device performance. In some embodiments, the inner spacer etch-back (trim) process may be performed using a wet etch, a dry etch, or a combination thereof. In some cases, the inner spacer etch-back (trim) process may include cycles of a high temperature sulfuric peroxide mixture (HTSPM) and dilute hydrofluoric acid (dHF), ozone ($O_3$) and dHF, or a combination thereof. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method that includes providing a fin having a stack of epitaxial layers including a plurality of semiconductor channel layers interposed by a plurality of dummy layers. In some embodiments, the method further includes performing a source/drain etch process to remove portions of the stack of epitaxial layers in source/drain regions to form trenches that expose lateral surfaces of the plurality of semiconductor channel layers and the plurality of dummy layers. In some examples, the method further includes performing a dummy layer recess process to laterally etch the plurality of dummy layers to form recesses along sidewalls of the trenches. In various embodiments, the method further includes depositing an inner spacer material along sidewalls of the trenches and within the recesses. In some embodiments, the method further includes performing an inner spacer etch-back process to remove the inner spacer material from the sidewalls of the trenches and to remove a portion of the inner spacer material from within the recesses to form inner spacers having a first dish-like region along lateral surfaces of the inner spacers.

In another of the embodiments, discussed is a method that includes forming a first fin including a first stack of epitaxial layers and a second fin including a second stack of epitaxial layers. In some embodiments, each of the first and second stacks of epitaxial layers include a plurality of semiconductor channel layers interposed by a plurality of dummy layers. In some examples, the first fin and the second fin are separated by a trench that exposes first lateral surfaces of the first stack of epitaxial layers along a first sidewall of the trench and second lateral surfaces of the second stack of epitaxial layers along a second sidewall of the trench opposite the first sidewall of the trench. In some embodiments, the method further includes laterally etching the plurality of dummy layers in each of the first and second stacks of epitaxial layers to form a first recess along the first sidewall of the trench and a second recess along the second sidewall of the trench. In some cases, the second recess is level with the first recess. In various embodiments, the method further includes conformally depositing an inner spacer material along the first and second sidewalls of the trench and within the first and second recesses. In some embodiments, the method further includes performing an inner spacer trim process that removes the inner spacer material from the first and second sidewalls of the trench and from at least part of each of the first and second recesses to form a first dished inner spacer within the first recess and a second dished inner spacer within the second recess.

In yet another of the embodiments, discussed is a semiconductor device including a fin extending from a substrate. In various examples, the fin includes a plurality of semiconductor channel layers. In some embodiments, the semiconductor device further includes inner spacers disposed between adjacent semiconductor channel layers of the plurality of semiconductor channel layers and on either side of a channel region. In various examples, the inner spacers include a dish-like region facing a source/drain region. In some embodiments, the semiconductor device further includes a source/drain feature disposed within the source/drain region and in contact with the dish-like region of the inner spacers and with end portions of the plurality of semiconductor channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of fabricating a semiconductor device, comprising:
    providing a fin including a stack of epitaxial layers including a plurality of semiconductor channel layers interposed by a plurality of dummy layers;
    performing a source/drain etch process to remove portions of the stack of epitaxial layers in source/drain regions to form trenches that expose lateral surfaces of the plurality of semiconductor channel layers and the plurality of dummy layers;

performing a dummy layer recess process to laterally etch the plurality of dummy layers to form recesses along sidewalls of the trenches;

conformally depositing an inner spacer material along sidewalls of the trenches and within the recesses, wherein first portions of the inner spacer material conformally deposited on the exposed lateral surfaces of the plurality of semiconductor channel layers have a first thickness, wherein second portions of the inner spacer material conformally deposited within the recesses and between adjacent first portions of the inner spacer material define a dish-like region having a first depth measured from a first plane defined by an exposed surface of the inner spacer material disposed on the lateral surfaces of the plurality of semiconductor channel layers to an apex of the dish-like region, and wherein the first depth of the dish-like region is less than the first thickness; and performing an inner spacer etch-back process to remove the first and second portions of the inner spacer material from the sidewalls of the trenches and from at least part of the recesses to increase the first depth of the dish-like region to a second depth greater than the first depth and to form inner spacers having a first lateral surface in contact with a respective one of the dummy layers and a second lateral surface opposite the first lateral surface, the second lateral surface including the dish-like region having the second depth.

2. The method of claim 1, wherein the second depth is measured from a second plane defined by an exposed lateral surface of an adjacent semiconductor channel layer to the apex of the dish-like region.

3. The method of claim 2, wherein the second depth is greater than 1 nm.

4. The method of claim 1, wherein an angle 'θ' is defined between a horizontal surface of an adjacent semiconductor channel layer and an exposed surface of the dish-like region.

5. The method of claim 4, wherein the angle 'θ' is greater than 30 degrees.

6. The method of claim 1, further comprising:
after performing the inner spacer etch-back process, forming epitaxial source/drain features within the source/drain regions, wherein the epitaxial source/drain features include portions that extend into and contact the first-dish-like region.

7. The method of claim 6, wherein the portions of the epitaxial source/drain features that extend into and contact the first-dish-like region also interpose ends of adjacent semiconductor channel layers.

8. The method of claim 1, wherein the first dish-like region has a triangular or concave shape.

9. The method of claim 1, wherein the inner spacer etch-back process includes cycles of a high temperature sulfuric peroxide mixture (HTSPM) and dilute hydrofluoric acid (dHF), ozone ($O_3$) and dHF, or a combination thereof.

10. A method, comprising:
forming a first fin including a first stack of epitaxial layers and a second fin including a second stack of epitaxial layers, wherein each of the first and second stacks of epitaxial layers include a plurality of semiconductor channel layers interposed by a plurality of dummy layers, and wherein the first fin and the second fin are separated by a trench that exposes first lateral surfaces of the first stack of epitaxial layers along a first sidewall of the trench and second lateral surfaces of the second stack of epitaxial layers along a second sidewall of the trench opposite the first sidewall of the trench;

laterally etching the plurality of dummy layers in each of the first and second stacks of epitaxial layers to form a first recess along the first sidewall of the trench and a second recess along the second sidewall of the trench, the second recess level with the first recess;

conformally depositing an inner spacer material layer along the first and second sidewalls of the trench and within the first and second recesses, wherein the inner spacer material layer has a first thickness and defines respective dish-like regions adjacent to the first and second recesses, the respective dish-like regions having a first depth less than the first thickness; and performing an inner spacer trim process that removes the inner spacer material from the first and second sidewalls of the trench and from at least part of each of the first and second recesses to increase the first depth of the respective dish-like regions to a second depth greater than the first depth and to form a first dished inner spacer within the first recess and a second dished inner spacer within the second recess, wherein the inner spacer trim process includes cycles of a high temperature sulfuric peroxide mixture (HTSPM) and dilute hydrofluoric acid (dHF);

wherein the first and second dished inner spacers each have a first side surface in contact with a respective dummy layer in respective ones of the first and second stacks of epitaxial layers and a second side surface opposite the first side surface, the second side surface including a dished profile.

11. The method of claim 10, wherein each of first and second dished inner spacers include upper, middle, and lower portions, and wherein a first distance between opposing middle portions of the first and second dished inner spacers is greater than a second distance between opposing upper or lower portions of the first and second dished inner spacers.

12. The method of claim 10, wherein the dished profile has a triangular or concave shape.

13. The method of claim 10, further comprising:
after performing the inner spacer trim process, forming a source/drain feature within the trench and within at least part of each of the first and second recesses, wherein the source/drain feature contacts each of the first and second dished inner spacers.

14. The method of claim 13, wherein portions of the source/drain feature formed within the at least part of each of the first and second recesses interpose ends of adjacent semiconductor channel layers within respective ones of the first and second fins.

15. The method of claim 10, wherein the inner spacer trim process further includes cycles of dilute hydrofluoric acid (dHF), ozone ($O_3$) and dHF.

16. A method, comprising:
etching a first lateral surface of a dummy layer between adjacent semiconductor channel layers, the first lateral surface of the dummy layer and second lateral surfaces of the adjacent semiconductor channel layers defining a sidewall, wherein the etching the first lateral surface forms a recess along the sidewall, and wherein after the etching the first lateral surface, the first lateral surface of the dummy layer has vertical profile;

depositing a layer of inner spacer material along the sidewall and within the recess, wherein the layer of inner spacer material has a first thickness and defines a dish-like region adjacent to the recess, the dish-like region having a first depth less than the first thickness;

performing an inner spacer etch-back process to remove the layer of inner spacer material from the sidewall and to remove a portion of the layer of inner spacer material from within the recess to increase the first depth of the dish-like region to a second depth greater than the first depth and to form an inner spacer having a first side surface in contact with the vertical profile of the dummy layer and a second side surface opposite the first side surface, the second side surface including the dish-like region; and after performing the inner spacer etch-back process, forming a source/drain feature including a portion that extends into and contacts the dish-like region.

17. The method of claim 16, wherein the second depth is measured from a plane defined by the second lateral surfaces of the adjacent semiconductor channel layers to an apex of the dish-like region, and wherein the second depth is greater than 1 nm.

18. The method of claim 16, wherein an angle 'θ' is defined between a horizontal surface of one of the adjacent semiconductor channel layers and a surface of the dish-like region, and wherein the angle 'θ' is greater than 30 degrees.

19. The method of claim 16, wherein the first depth is measured from a plane defined by an exposed surface of the layer of inner spacer material disposed on the second lateral surfaces of the adjacent semiconductor channel layers to an apex of the dish-like region.

20. The method of claim 16, wherein the inner spacer etch-back process includes cycles of a high temperature sulfuric peroxide mixture (HTSPM) and dilute hydrofluoric acid (dHF).

\* \* \* \* \*